United States Patent
Kraus

[11] Patent Number: 5,901,088
[45] Date of Patent: May 4, 1999

[54] SENSE AMPLIFIER UTILIZING A BALANCING RESISTOR

[75] Inventor: William F. Kraus, Colorado Springs, Colo.

[73] Assignee: Ramtron International Corporation, Colorado Springs, Colo.

[21] Appl. No.: 09/022,106

[22] Filed: Feb. 11, 1998

[51] Int. Cl.$^6$ .................................................. G11C 16/06
[52] U.S. Cl. ................... 365/185.21; 365/100; 365/196; 327/52; 327/55
[58] Field of Search .................................. 365/205, 207, 365/185.21, 196, 100; 327/51, 52, 55

[56] References Cited

U.S. PATENT DOCUMENTS

| | | |
|---|---|---|
| 3,739,365 | 6/1973 | Radcliffe, Jr. . |
| 4,158,241 | 6/1979 | Takemae et al. . |
| 4,247,791 | 1/1981 | Rovell ..................... 365/205 |
| 4,261,044 | 4/1981 | Closson et al. . |
| 4,318,187 | 3/1982 | Seitchik et al. . |
| 4,514,828 | 4/1985 | Closson et al. . |
| 4,521,703 | 6/1985 | Dingwall ..................... 307/530 |
| 4,541,006 | 9/1985 | Ariizumi et al. ................ 365/182 |
| 4,883,985 | 11/1989 | Katsu et al. ..................... 365/205 |
| 4,948,993 | 8/1990 | Chin et al. . |
| 5,017,815 | 5/1991 | Shah et al. ..................... 365/205 |
| 5,336,242 | 8/1994 | Zadeh . |
| 5,498,984 | 3/1996 | Schaffer . |
| 5,619,467 | 4/1997 | Sim ..................... 365/207 |
| 5,627,494 | 5/1997 | Somerville . |
| 5,696,726 | 12/1997 | Tsukikawa ..................... 365/205 |

*Primary Examiner*—David Nelms
*Assistant Examiner*—Anh Phung
*Attorney, Agent, or Firm*—Peter J. Meza, Esq.

[57] ABSTRACT

A cross-coupled sense amplifier includes a voltage-compensating balancing resistor serially connected between the drain of one of the P-channel transistors in the sense amplifier and the corresponding sensing/bit line node. The value of the balancing resistor is optimized so that the voltage imbalance between the P-channel transistor is minimized and sense amplifier sensitivity is maximized. A balancing resistor can also be placed in the N-channel transistors in the sense amplifier if desired. The balancing resistor in a typical application is about 100 to 200 ohms and fabricated from polysilicon.

12 Claims, 7 Drawing Sheets

SENSE AMPLIFIER UTILIZING A BALANCING RESISTOR

BACKGROUND OF THE INVENTION

This invention relates generally to sense amplifiers. More particularly, the present invention relates to a sense amplifier for use in an integrated circuit memory that is compensated for current and resistive load imbalances.

A prior art cross-coupled sense amplifier is shown in FIG. 1. Sense amplifier 10 includes first and second P-channel transistors 20 and 22. The sources of transistors 20 and 22 are coupled to a VDD power node, which is energized typically by a five volt, 3.3 volt, or three volt power supply. The gates and drains of P-channel transistors 20 and 22 are cross-coupled to form the sensing nodes for one half of the sense amplifier and are coupled to bit node 16 and complementary bit node 18. The cross-coupling of transistors 20 and 22 provides positive feedback for amplifying small charges developed on bit lines 16 and 18 into full complementary logic levels. Similarly, sense amplifier 10 also includes first and second N-channel transistors 24 and 26. The sources of transistors 24 and 26 are coupled to a ground node, which is typically zero volts, but could also be a voltage less than the VDD voltage, including negative voltages. The gates and drains of N-channel transistors 24 and 26 are also cross-coupled to form the sensing nodes for the other half of the sense amplifier and are also coupled to bit node 16 and complementary bit node 18. The cross-coupling of transistors 24 and 26 also provides positive feedback for amplifying small charges developed on bit lines 16 and 18 into full complementary logic levels.

Referring now to FIG. 2, a plan view of a prior art layout for sense amplifier 10 and a portion of a memory column is shown. Sense amplifier 10 is shown as a rectangle including portions 24, 26, 20 and 22 corresponding to the transistors shown in FIG. 1. A column of representative memory cells 28 are shown. In operation, one of the memory cells 28 in the column shown in FIG. 2 is selected and its complementary data state is resolved into full logic levels by sense amplifier 10. Note that in FIG. 2, the layout of sense amplifier 10 is "in pitch", meaning that the width of the entire sense amplifier is contained within the width of one column of memory cells 28. While this is advantageous as far as the integrated circuit layout is concerned, there are serious corresponding disadvantages concerning electrical performance. Specifically, the imbalance in the parasitic interconnect resistances due to the strict layout confines results in a built-in voltage offset that can affect the sensitivity of the sense amplifier.

What is desired, therefore, is a circuit and method for compensating a cross-coupled sense amplifier to optimize electrical performance and increase sensitivity.

SUMMARY OF THE INVENTION

It is, therefore, a principal object of the present invention to compensate a sense amplifier for voltage imbalances due to interconnect resistance imbalances and/or bit line load imbalances.

According to the present invention, a cross-coupled sense amplifier includes a voltage-compensating balancing resistor serially connected between the drain of one of the P-channel transistors in the sense amplifier and the corresponding sensing/bit line node. The value of the balancing resistor is optimized so that the voltage imbalance between the P-channel transistor is minimized and sense amplifier sensitivity is maximized. A balancing resistor can also be placed in the N-channel transistors in the sense amplifier if desired. The balancing resistor in a typical application is about 100 to 200 ohms and fabricated from polysilicon.

The foregoing and other objects, features and advantages of the invention will become more readily apparent from the following detailed description of a preferred embodiment of the invention which proceeds with reference to the accompanying drawings.

DETAILED DESCRIPTION

Figure 1:
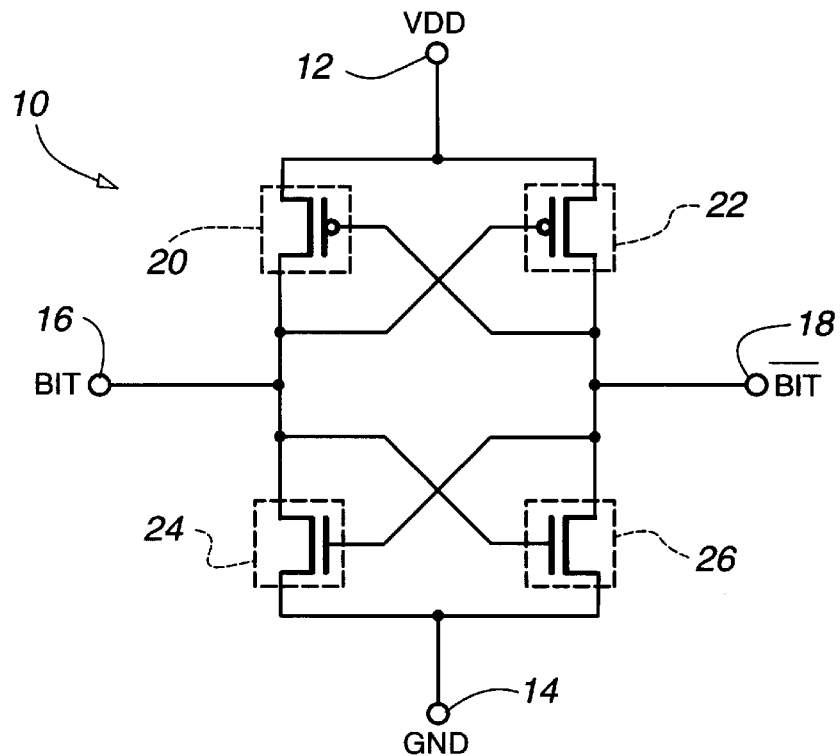
FIG. 1 is schematic diagram of a prior art cross-coupled sense amplifier.
Figure 2:
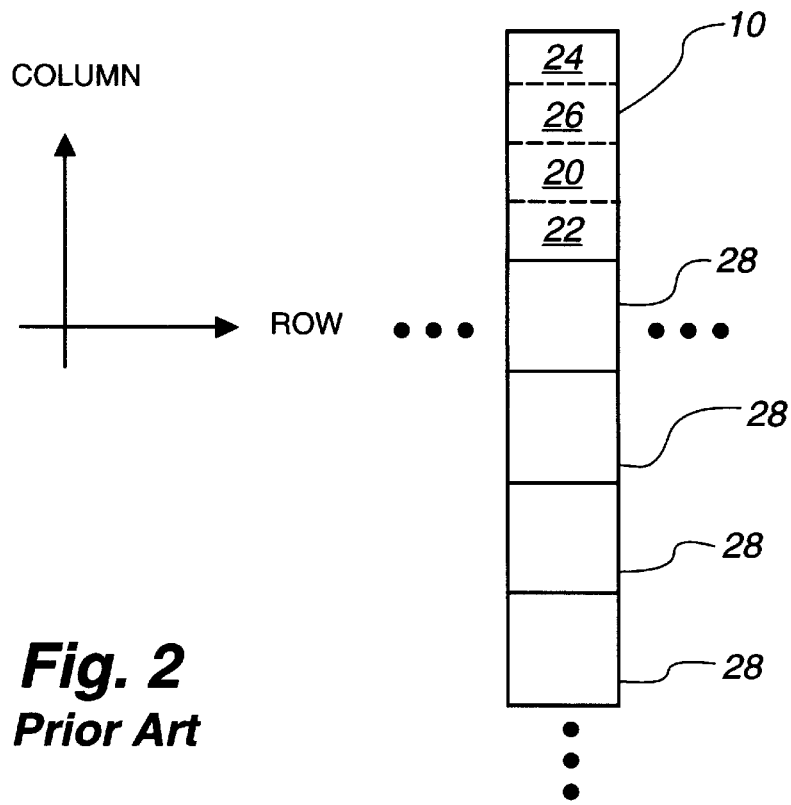
FIG. 2 is a plan view of a portion of a prior art memory layout including the sense amplifier of FIG. 1 and a portion of an associated memory column.
Figure 3:
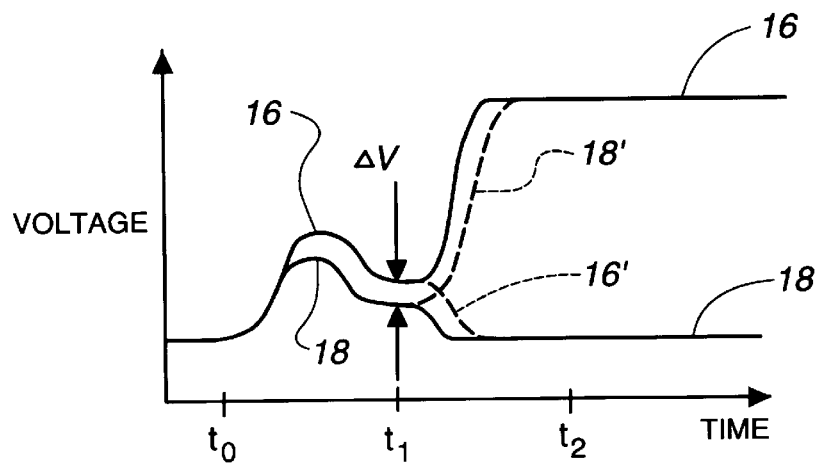
FIG. 3 is a plot of voltage versus time showing the bit line voltage waveforms for balanced and unbalanced sense amplifiers.

Referring now to FIG. 3, a plot is shown of voltage on a pair of complementary bit lines 16 and 18 versus time. The bit line voltages shown in FIG. 3 are the result of the "up-down" sensing method performed on a ferroelectric memory cell. Other sensing methods, as well as other memory types, including non-ferroelectric memories can be used in conjunction with the balanced sense amplifier of the present invention. The solid traces 16 and 18 depict the initial bit line voltages developed into the correct logic levels using a sense amplifier corrected according to the present invention. The dashed traces 16' and 18' depict the initial bit line voltages actually developed into incorrect logic levels using an unbalanced sense amplifier. At time t0 the voltage on both bit lines is zero. At time t1, the charge from a memory cell, for example a 2T/2C ferroelectric memory cell, is transferred to the bit lines, developing a small differential voltage labeled "ΔV". Subsequently to time t1, the sense amplifier (not shown in FIG. 3) is latched, and the small differential voltage ΔV is amplified. Solid traces 16 and 18 represent the correct logic high and low levels, respectively, e.g. five volts and ground. The correct logic levels are attained using a very sensitive sense amplifier, which is correctly balanced according to the present invention. Note that traces 16' and 18' cross and are developed into the incorrect logic levels. This represents the poor performance of an incorrectly balanced sense amplifier in which the built-in voltage offset between the sensing transistors overwhelms the voltage information on the bit lines.

Figure 4:
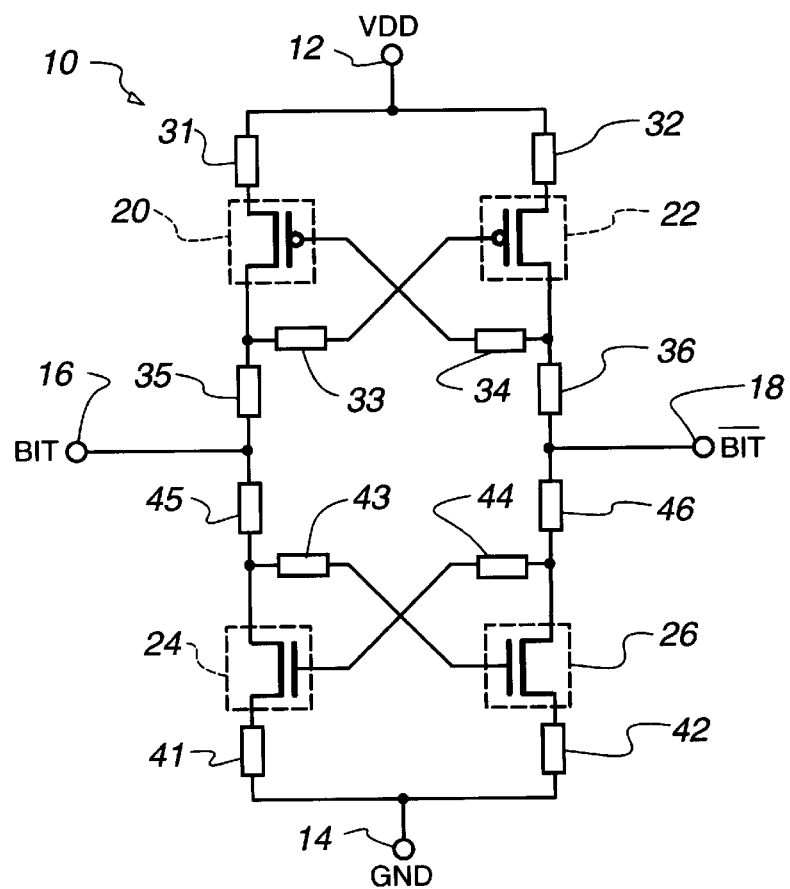
FIG. 4 is a schematic diagram of a cross-coupled sense amplifier including interconnect resistances modeled as lumped resistors.

In FIG. 4, sense amplifier 10 has been expanded to show all the interconnect resistances as lumped resistive elements. Resistors 31 and 32 represent the interconnect resistance between the sources of transistors 20 and 22, and the power supply node 12. Resistors 33 and 34 represent the interconnect resistance between the gates of transistors 20 and 22 and the cross-coupled connection to the drain of the opposite transistor. Resistors 35 and 36 represent the interconnect resistance between the drains of transistors 20 and 22 and the bit nodes 16 and 18. Similarly, resistors 41 and 42 represent the interconnect resistance between the sources of transistors 24 and 26, and the ground node 14. Resistors 43 and 44 represent the interconnect resistance between the gates of transistors 24 and 26 and the cross-coupled connection to the drain of the opposite transistor. Resistors 45 and 46 represent the interconnect resistance between the drains of transistors 24 and 26 and the bit nodes 16 and 18.

Studies and simulations have shown that the interconnect resistance with the most effect on imbalance and lack of sensitivity are resistors 35 and 36 for ground-referenced bit line voltages, and resistors 45 and 46 for VDD-referenced bit line voltages. Imbalances between other resistor pairs shown in FIG. 4 have only a minimal effect on sense amplifier sensitivity and performance.

Figure 5:
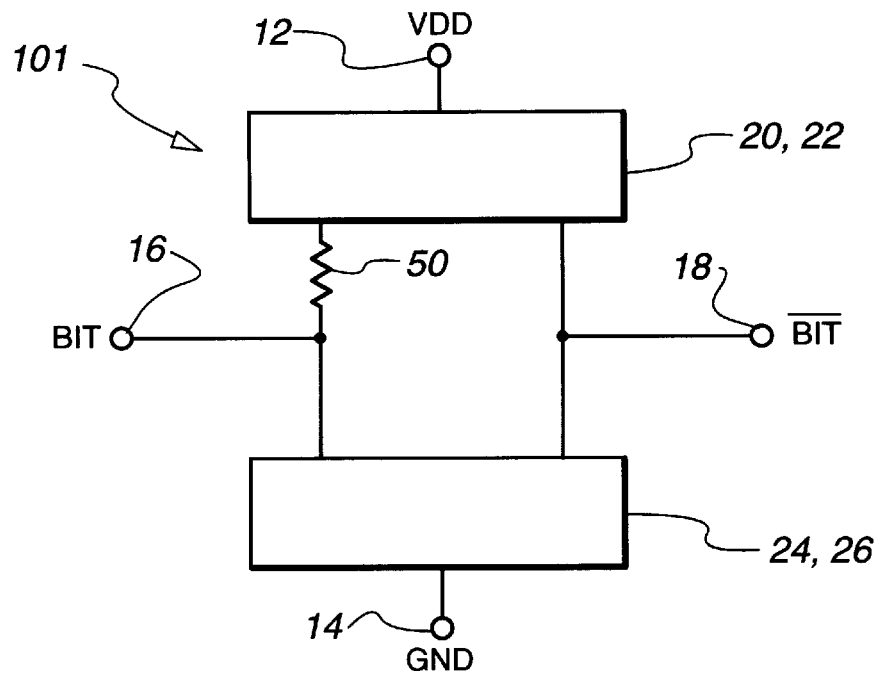
FIGS. 5–9 are schematic diagrams of sense amplifiers having one or more voltage balancing resistors according to the present invention.
Figure 6:
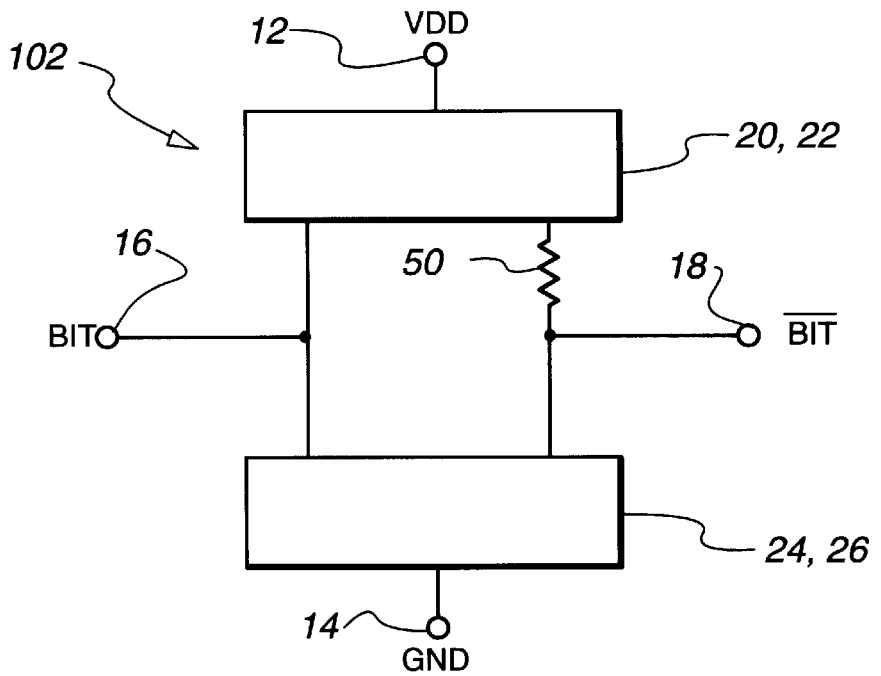

A balanced sense amplifier 101 with increased sensitivity corrected according to the present invention is shown in FIG. 5. Sense amplifier 101 is for use with ground-referenced bit line voltages. Transistors 20 and 22 are represented by a single block, and transistors 24 and 26 are represented by a single block. In sense amplifier 101 the interconnect resistance of the sense amplifier associated with bit node 16 is less than that associated with bit node 18. This is due primarily to the layout constraints discussed above, but can also be affected by the bit line load, as is discussed in further detail below. Resistor 50 represents the additional resistance required to match the total resistance of bit nodes 16 and 18, so that the voltage imbalance at the internal sensing nodes (drains) of transistors 20 and 22 is minimized. A typical sense amplifier 101 may have a resistor 50 fabricated in polysilicon with a value of between 100 and 200 ohms. Of course, the exact value and material of resistor 50 will be changed according to the amount of imbalance that must be corrected and the materials available for fabricating resistors in any given semiconductor process. A sense amplifier 102 also for use with ground-based voltages is shown in FIG. 6, in which the voltage offset or imbalance is corrected by the placing the additional balancing resistor 50 in the bit node 18 side of the amplifier, since the interconnect resistance associated with bit node 18 is less than that of bit node 16.

Figure 7:
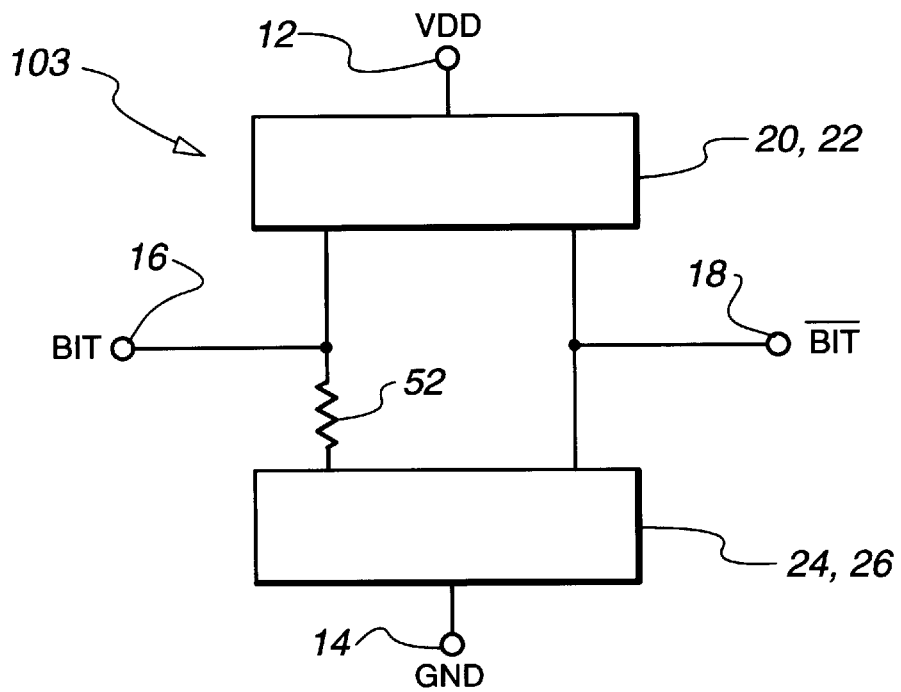
Figure 8:
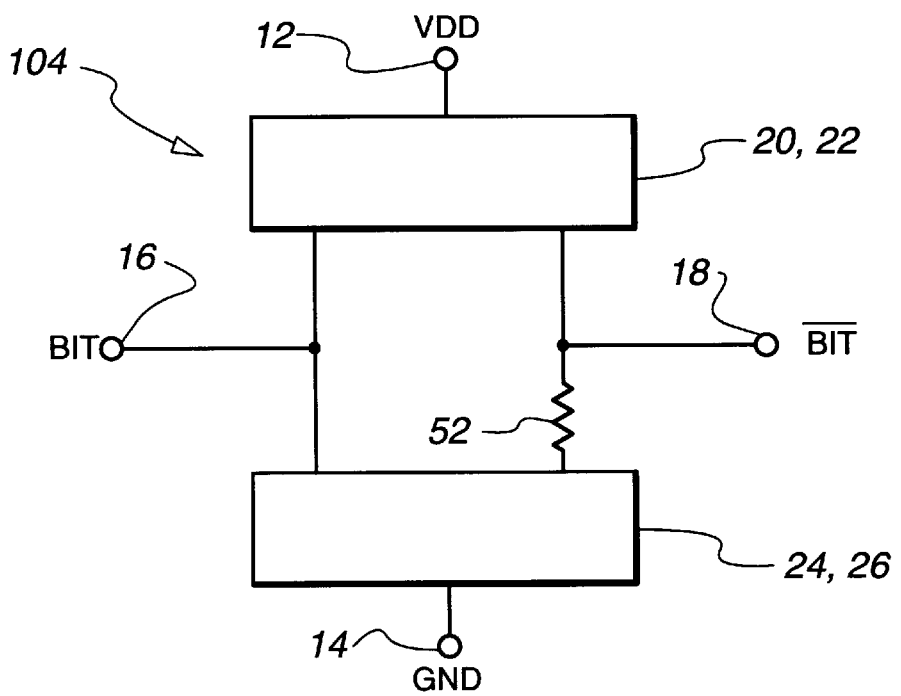

A balanced sense amplifier 103 with increased sensitivity corrected according to the present invention is shown in FIG. 7. Sense amplifier 103 is for use with VDD-referenced bit line voltages. Transistors 20 and 22 are represented by a single block, and transistors 24 and 26 are represented by a single block. In sense amplifier 103 the interconnect resistance of the sense amplifier associated with bit node 16 is less than that associated with bit node 18. This is due primarily to the layout constraints discussed above, but can also be affected by the bit line load, as is discussed in further detail below. Resistor 50 represents the additional resistance required to match the total resistance of bit nodes 16 and 18, so that the voltage imbalance at the internal sensing nodes of transistors 20 and 22 is minimized. A typical sense amplifier 103 may have a resistor 50 fabricated in polysilicon with a value of between 100 and 200 ohms. Of course, the exact value and material of resistor 50 will be changed according to the amount of imbalance that must be corrected and the materials available for fabricating resistors in any given semiconductor process. A sense amplifier 104 also for use with VDD-based voltages is shown in FIG. 8, in which the voltage offset or imbalance is corrected by the placing the additional balancing resistor 50 in the bit node 18 side of the amplifier, since the interconnect resistance associated with bit node 18 is less than that of bit node 16.

Figure 9:
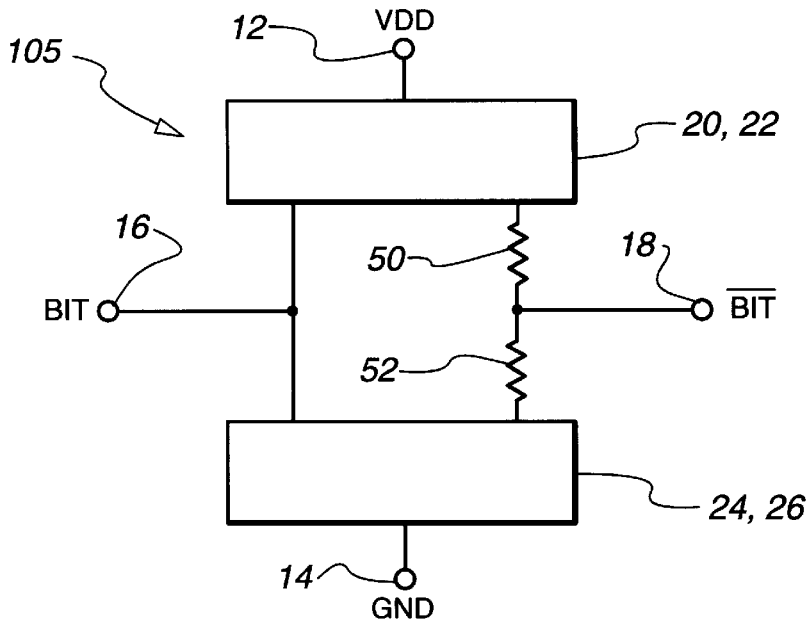

A sense amplifier 105 for use in either ground or VDD based bit line voltages is shown in FIG. 9. Sense amplifier 105 could be used with memory architectures that alternatively reference the bit lines to both ground and VDD. In FIG. 9, sense amplifier 105 is shown as being balanced using both resistors 50 and 52, which are both in the bit node 18 "legs" of the sense amplifier. Those skilled in the art will realize that there are four possible permutations of the placement of resistors 50 and 52 shown in FIG. 9. The exact configuration for balancing the sense amplifier 105 will be determined by the layout chosen, and by an analysis of the interconnect resistance associated with a given layout.

Figure 10:
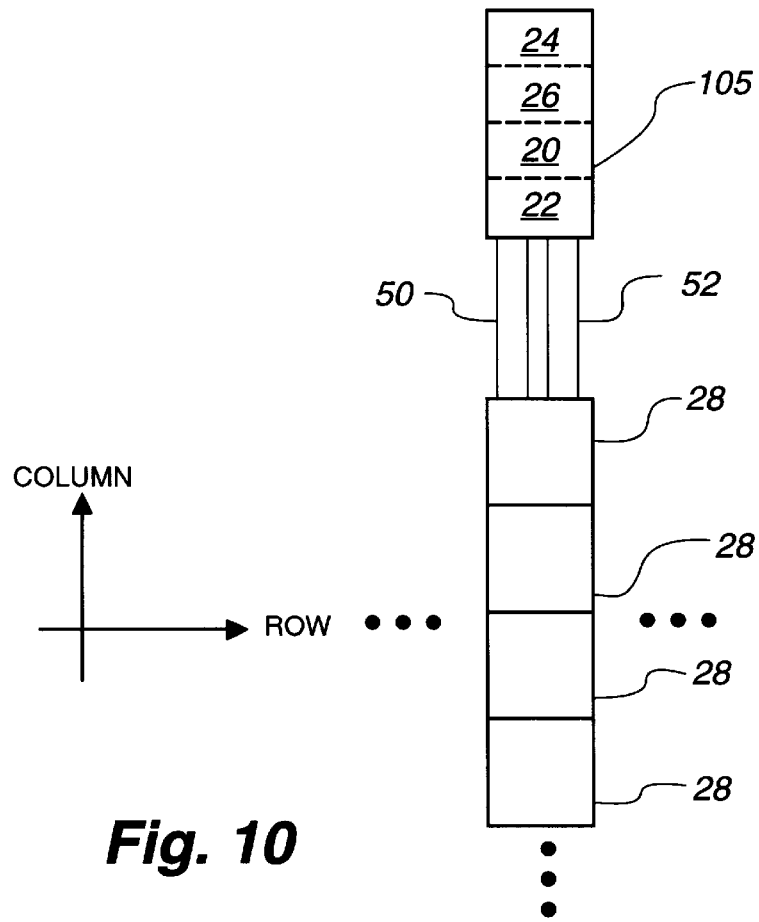
FIG. 10 is a plan view of a portion of a memory layout including a balanced sense amplifier and two balancing resistors according to the present invention.

A representative layout for a sense amplifier 105 and balancing resistors 50 and 52 is shown in FIG. 10. Sense amplifier 105 is shown having transistors 24, 26, 20, and 22. Balancing resistors 50 and 52 are placed between the sense amplifier 105, and the column of memory cells 28. The basic placement of resistors 50 and 52 shown in FIG. 10 can be easily modified for the layout of sense amplifiers 101–104. The exact size and placement of resistors 50 and/or 52 can be adjusted as required by a given set of layout rules or size constraints.

Figure 11:
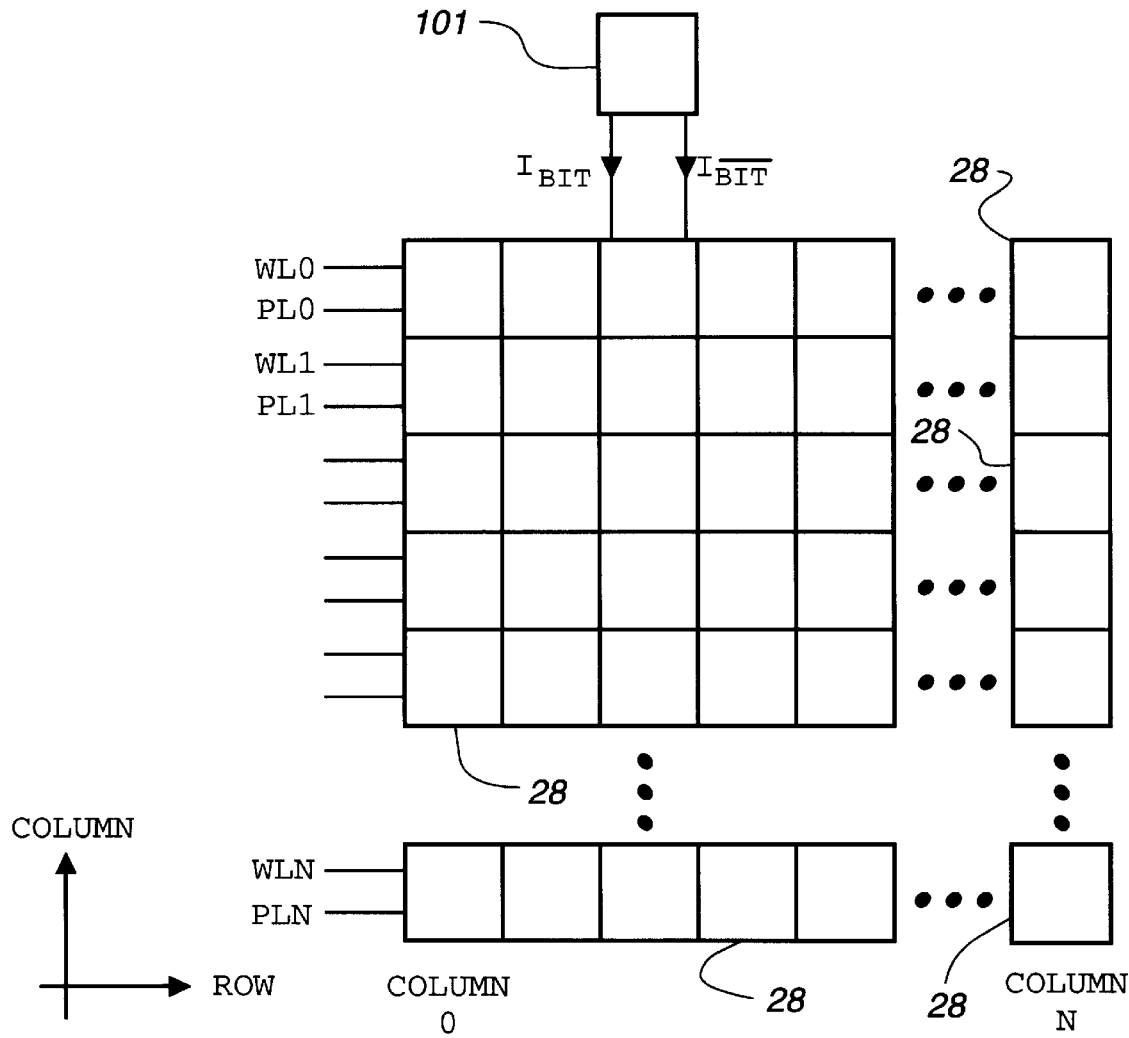
FIG. 11 is a plan view of a memory array layout.
Figure 12:
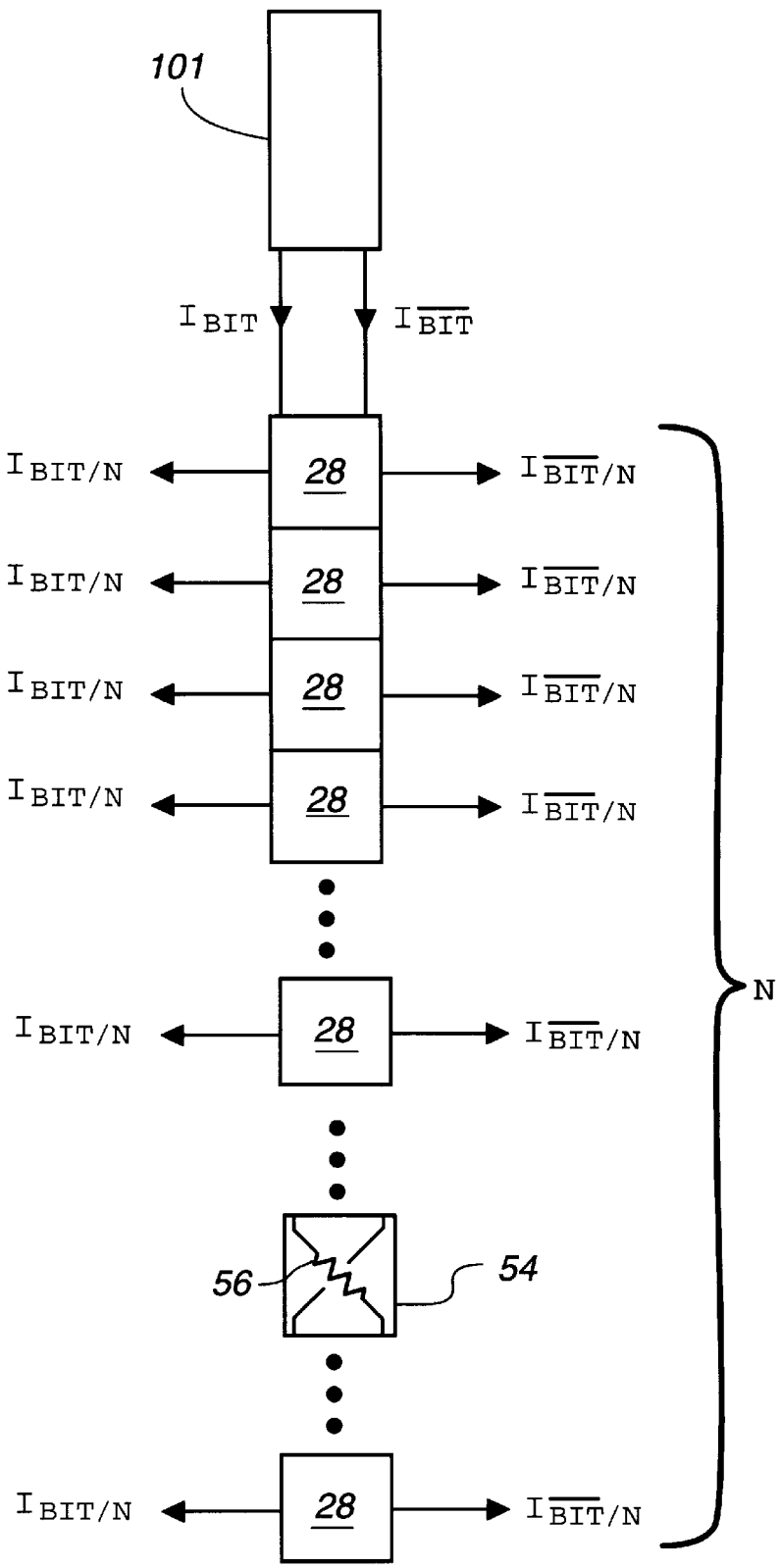
FIG. 12 is a plan view of a portion memory array layout showing in particular a column of memory cells and associated bit line current paths.

A layout of a portion of a memory array is shown in FIG. 11. While it is very important that the internal sense amplifier resistive interconnect and voltage offset be measured, it is equally important to analyze any imbalances associated with the memory array. The load currents for the bit lines are shown in FIG. 11 as $I_{BIT}$ and $I_{/BIT}$. These currents are actually complex distributed currents, which are the sum of all of the currents associated with each individual memory cell, as well as other memory array features. A single column of the memory array is shown in FIG. 12, in conjunction with sense amplifier 101. Note that each memory cell 28 has an associated bit line load current contribution labeled $I_{BIT/N}$ and $I_{/BIT/N}$. Each of these terms are ideally added together to form a true representation of the total bit line currents. Note also in FIG. 12 that additional resistive elements such as a bit-twist 54, modeled with resistor 56, should be taken into account, when analyzing the total imbalance of the sense amplifier and load.

Figure 13:
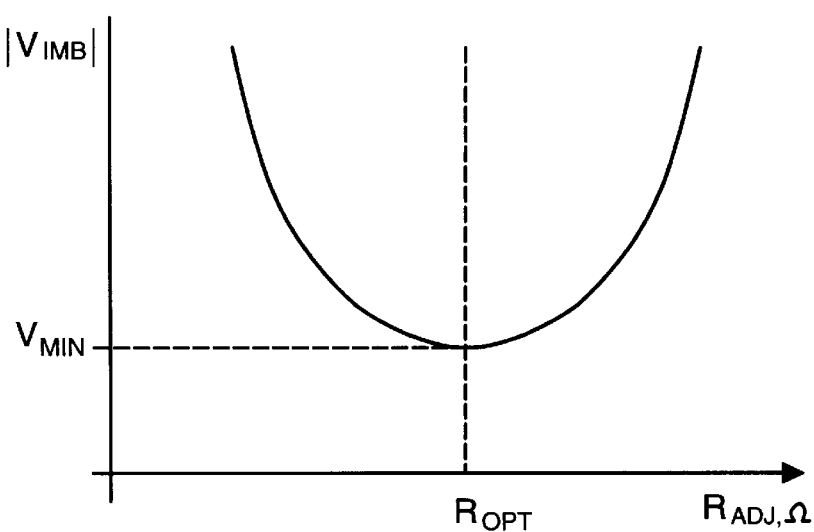
FIG. 13 is a plot of voltage versus resistance, showing the optimum resistance level for the balancing resistor according to the present invention.

Turning now to FIG. 13, the absolute value of the voltage imbalance $V_{IMB}$ at the internal sensing nodes is measured as a function of the adjustment or balancing resistor $R_{ADJ}$, once all of the internal interconnect and load currents and resistances are modeled. An optimized value of the balancing resistor $R_{OPT}$ exists corresponding to a minimum voltage offset. While the offset value may not be zero, it will be minimized and the sensitivity of the sense amplifier is increased.

In sum, the sense amplifier according to the present invention includes a pair of cross-coupled transistors coupled between a power node and first and second bit nodes, and a balancing resistor coupled in series between one of the bit nodes and the corresponding transistor, the balancing resistor having a resistance value that is optimized such that the voltage offset between the sense amplifier transistors is minimized. The balancing resistor has a resistance value between about 100 and 200 ohms and can be formed of polysilicon. A sense amplifier having a pair of cross-coupled P-channel transistors and/or a pair of N-channel cross-coupled transistors can be used. Either or both of these pairs of transistors can be compensated, depending upon the referencing of the bit line voltages.

In operation, the method of balancing a sense amplifier according to the present invention includes determining the parasitic resistance and current load associated with each bit node, inserting a balancing resistor between one of the transistors and the bit node determined to have the lesser of the two bit node resistances, and setting the resistor value so that the voltage offset between the transistors is minimized.

Having described and illustrated the principle of the invention in a preferred embodiment thereof, it is appreciated by those having skill in the art that the invention can be modified in arrangement and detail without departing from such principles. For example, the material type and value of the adjustment or balancing resistor can be changed as required. The exact layout and placement of the balancing resistors can also be changed as desired. In addition, the balanced sense amplifier of the present invention can be used with any type of memory cell, including 1T-1C and 2T-2C ferroelectric memory cells, as well as non-ferroelectric memory cells. I therefore claim all modifications and variations coming within the spirit and scope of the following claims.

I claim:

1. A sense amplifier comprising:
   a pair of cross-coupled transistors coupled between a power node and first and second bit nodes; and
   a balancing resistor coupled in series between one of the bit nodes and the corresponding transistor, the balancing resistor having a resistance value that is optimized such that the voltage offset between the sense amplifier transistors is minimized.

2. A sense amplifier as in claim 1 in which the balancing resistor has a resistance value between about 100 and 200 ohms.

3. A sense amplifier as in claim 1 in which the balancing resistor comprises polysilicon.

4. A sense amplifier for coupling to an unbalanced column of memory cells comprising:
   first and second P-channel transistors each having a source, drain, and a gate, the sources of the first and second P-channel transistors being coupled to a power node, the gate of the first P-channel transistor being coupled to the drain of the second P-channel transistor to form a first bit node, and the gate of the second P-channel transistor being coupled to the drain of the first P-channel transistor to form a second bit node; and
   a balancing resistor coupled in series between the drain of one of the P-channel transistors and the corresponding bit node, the balancing resistor having a resistance value that is optimized such that the voltage offset between the first and second P-channel transistors is minimized.

5. A sense amplifier as in claim 4 in which the balancing resistor has a resistance value between about 100 and 200 ohms.

6. A sense amplifier as in claim 4 in which the balancing resistor comprises polysilicon.

7. A sense amplifier as in claim 4 further comprising first and second N-channel transistors each having a source, drain, and a gate, the sources of the first and second N-channel transistors being coupled to a ground node, the gate of the first N-channel transistor being coupled to the drain of the second N-channel transistor and to the first bit node, and the gate of the second P-channel transistor being coupled to the drain of the first N-channel transistor and to the second bit node.

8. A sense amplifier as in claim 7 further comprising a balancing resistor coupled in series between the drain of one of the N-channel transistors and the corresponding bit node, the balancing resistor having a resistance value that is optimized such that the voltage offset between the first and second N-channel transistors is minimized.

9. A sense amplifier as in claim 8 in which the balancing resistor has a resistance value between about 100 and 200 ohms.

10. A sense amplifier as in claim 8 in which the balancing resistor comprises polysilicon.

11. A method for balancing a sense amplifier including at least a pair of cross-coupled transistors having a power or ground node and first and second bit nodes, the method comprising:
    inserting a balancing resistor between one of the transistors and the associated bit node;
    optimizing the resistor value so that the voltage offset between the transistors is minimized.

12. A method of balancing a sense amplifier including at least a pair of cross-coupled transistors having a power or ground node and first and second bit nodes coupled to an unbalanced column of memory cells, the method comprising:
    determining the parasitic resistance and current load associated with each bit node;
    inserting a balancing resistor between one of the transistors and the bit node determined to have the lesser of the two bit node resistances;
    setting the resistor value so that the voltage offset between the transistors is minimized.

* * * * *